United States Patent
Müller

(10) Patent No.: US 6,657,323 B2
(45) Date of Patent: Dec. 2, 2003

(54) ELECTRONIC PROXIMITY SWITCH

(75) Inventor: Jens Müller, Radevormwald (DE)

(73) Assignee: Werner Turck GmbH & Co. KG, Halver (DE)

( * ) Notice: Subject to any disclaimer, the term of this patent is extended or adjusted under 35 U.S.C. 154(b) by 395 days.

(21) Appl. No.: 09/805,731

(22) Filed: Mar. 13, 2001

(65) Prior Publication Data

US 2002/0070729 A1 Jun. 13, 2002

(30) Foreign Application Priority Data

Mar. 16, 2000 (DE) .......................... 100 12 830

(51) Int. Cl.[7] .............. G01B 7/14; H01H 36/00
(52) U.S. Cl. ............... 307/116; 361/180; 340/565
(58) Field of Search ..................... 307/116, 117; 340/565, 539.23; 361/180, 179, 181; 211/206; 250/227.22, 221

(56) References Cited

U.S. PATENT DOCUMENTS

| | | | | |
|---|---|---|---|---|
| 4,841,163 A | * | 6/1989 | Mueller ................ | 307/116 |
| 4,994,738 A | * | 2/1991 | Soyck et al. ........... | 324/207.13 |
| 5,264,733 A | * | 11/1993 | Tigges ................ | 307/116 |
| 5,973,318 A | * | 10/1999 | Plesko ................. | 250/227.22 |
| 6,545,612 B1 | * | 4/2003 | Lindgren et al. ........ | 340/686.6 |
| 2002/0070729 A1 | * | 6/2002 | Muller ................. | 324/207.26 |

FOREIGN PATENT DOCUMENTS

| | | |
|---|---|---|
| DE | 4031252 | 10/1991 |
| DE | 4429314 | 2/1996 |
| DE | 19623969 | 12/1997 |
| DE | 19834071 | 2/2000 |

* cited by examiner

Primary Examiner—Gregory J. Toatley, Jr.
(74) Attorney, Agent, or Firm—Martin A. Farber

(57) ABSTRACT

Electronic proximity switch with a member (1) generating an alternating electromagnetic field, which is excited by an oscillator (2), an influencing of the alternating field, induced by approach of a trigger, being evaluated by an electronic signal-evaluation stag (8), including an amplifier stage (5), for emission of an output signal. The signal to be evaluated, which is obtained by a member (3, 4) influenced by the electromagnetic field, is mixed with the oscillator frequency before its evaluation.

25 Claims, 6 Drawing Sheets

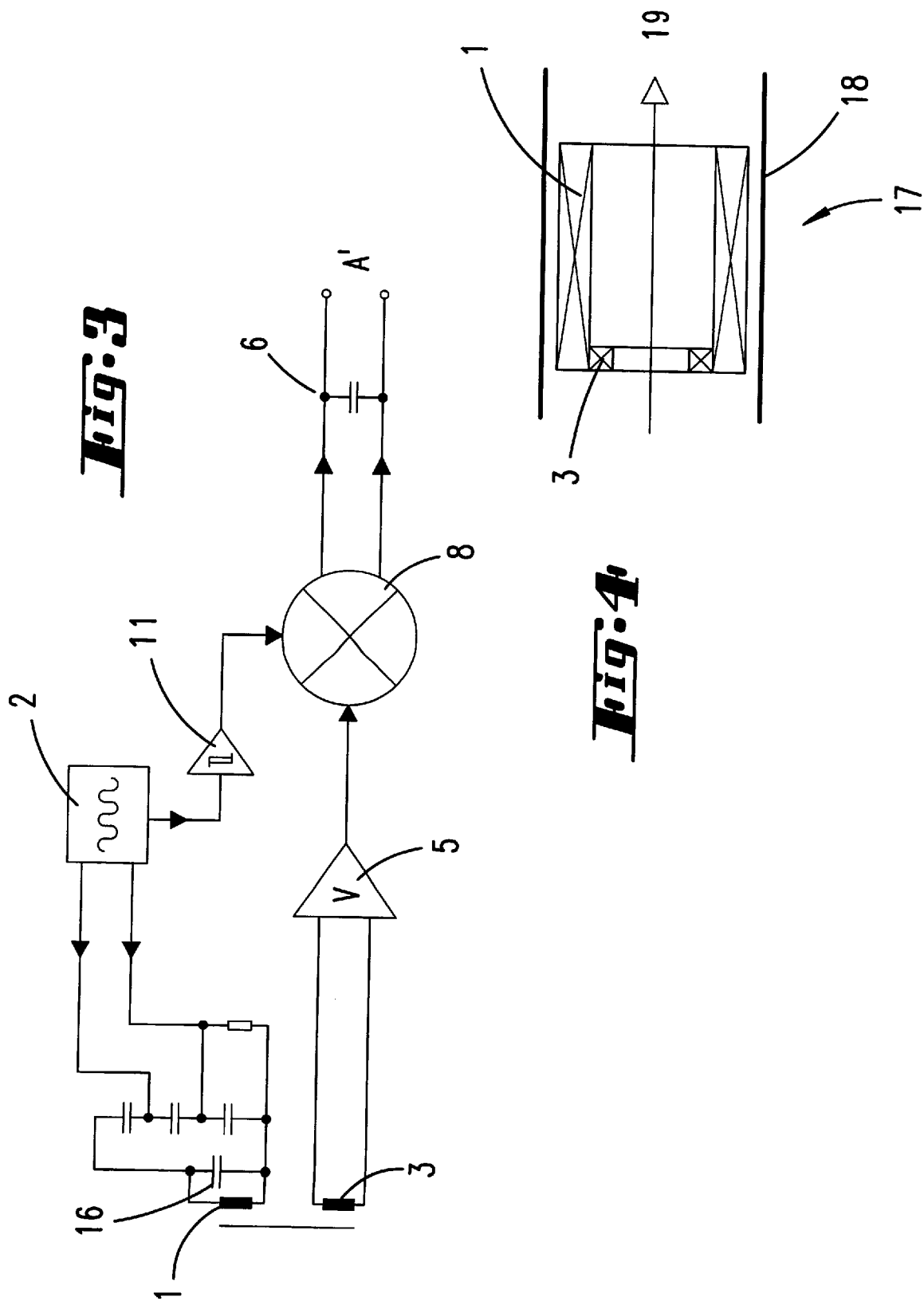

ELECTRONIC PROXIMITY SWITCH

FIELD AND BACKGROUND OF THE INVENTION

The invention relates to an electronic proximity switch with a member generating an electromagnetic alternating field, which is excited by an oscillator, an influencing of the alternating field, induced in particular by the approach of a trigger, being evaluated by an electronic signal-evaluation stage, including an amplifier stage, for the emission of an output signal.

A proximity switch of this type is already known for example from DE 40 31 252 C1. The proximity switch, which in that case is an inductive proximity switch, includes an oscillator, which generates an electromagnetic oscillation. This oscillation is coupled out as an electromagnetic alternating field by means of the oscillator coil. Provided in that case are two coils, connected in opposition in order to act as a differential coil arrangement, which are influenced by the electromagnetic field. If the electromagnetic field built up by the transmitting coil is disturbed by the approach of a metallic object, the fields in the two receiver coils alter. The differential signal is fed after amplification to a threshold switch or a rectifier and to a signal amplifier.

A proximity switch which operates on the same principle is described by DE 198 34 071.0.

Similarly, DE 44 29 314.3 describes a proximity switch with a differential coil arrangement.

DE 196 23 969 A1 describes a proximity switch, in particular a capacitive proximity switch, with a sensor electrode, in particular a conducting sensor surface, and an oscillator which applies an alternating voltage to the sensor electrode and the output signal of which is fed in a demodulated form to a threshold switch for the emission of the output signal, the switching distance of the proximity switch being adjustable. In this solution too, it is possible to speak of a field-generating member and a field-influenced member.

SUMMARY OF THE INVENTION

The invention is based on the object of reducing the interference susceptibility of an electronic proximity switch of the generic type.

Claim 1 describes as a solution to achieve the object the teaching that the signal to be evaluated has the oscillator frequency applied to it before its evaluation in the signal-evaluation stage. The signal to be evaluated is preferably emitted by a field-influenced member. This development on the one hand allows an offset on the measuring signal to be eliminated. On the other hand, it allows interference signals to be filtered out. In a first variant of the invention, it is provided that the inverted oscillator frequency is added to the measuring signal to compensate for offset. This may take place with the aid of an inverter and an inverting amplifier. As a result, an offset on the measuring signal is subtracted by the feeding in of the oscillator frequency of an identical phase. The amplitude of the oscillator signal fed in is in this case tuned to the uninfluenced amplitude of the measuring signal. Furthermore, it may be provided that at least two members which can be influenced by the field are provided. These members can be influenced by the field in different ways. A differential signal of these two measuring signals is then preferably used for the evaluation. In this case, it may be provided that each of the measuring signal [sic] emitted by the at least two members which can be influenced by the field has the oscillator frequency applied to it. In this case, either the fed-in oscillator frequency can be adapted to the amplitude of the uninfluenced measuring signal, or vice versa. In a preferred configuration, the member generating an electromagnetic field is an electrode, in particular a shielding electrode of a capacitive proximity switch. The members influenced by the field may then be formed by a main electrode or a compensation electrode. The compensation electrode in this case preferably has a lesser remote effect than the main electrode, so that the compensation electrode compensates for interferences in the direct vicinity of the sensor surface. In particular, an arrangement of this type can be used to compensate for voltage drifts and temperature drifts. The measuring signal subjected to addition is preferably passed to a mixer, to which the oscillator signal is likewise applied, the measuring signal being logically multiplied there by the oscillator frequency. A preferred area of use of the invention is that of capacitive proximity switches, in which the main electrode has a circular structure which is surrounded by the compensation electrode in an annular manner. A variant provides that a rotary trigger is located in front of the main electrode, can rotate about the center of the circle of the main electrode and effects a change in capacitance according to the angle of rotation. In this exemplary embodiment, the compensation electrode is preferably eccentrically disposed.

An independent variant of the teaching provided in claim 1 provides that the measuring signal emitted by the field-influenced member [sic] is logically multiplied in a mixer by the oscillator frequency. This has the consequence that substantially only the signals which are both in frequency conformity and phase conformity are evaluated. The mixer preferably has a square-wave signal applied to it, which is formed for example by a threshold switch from the sinusoidal oscillator signal. In this case, the mixing is substantially confined to a sign operation. If the measuring signal is in phase conformity with the oscillator frequency, the two half-waves are rectified by the multiplication. If there is a phase shift, both negative and positive signal contributions are mixed, so that a reduction in level is obtained in the downstream low-pass filter on account of the signal smoothing there. Measuring signals which have a frequency other than the oscillator frequency generate a beat-like mixing output signal, which can likewise be filtered out by the low-pass filter. In a preferred configuration, the proximity switch is in the form of an inductive proximity switch. It is also possible, however, for the circuitry according to the invention to be associated with a capacitive proximity switch. A variant of the invention provides that the measuring signal is formed from a difference between two individual signals. The field-generating member is preferably a transmitting coil. The member influenced by the field may be a single coil or one or more single coils. The member influenced by the field may, inter alia, be connected as a differential coil arrangement. It is also provided, however, that the member influenced by the field is a single coil and, in particular, merely a measuring coil. The member generating the field and the member which can be influenced by the field may, in addition, be capacitor-plate-like electrodes. In this case, the proximity switch in question is a capacitive proximity switch. In a further variant, it is provided that the oscillator frequency is modulated. In this variant, for example, the transmitting coil is not operated with a fixed frequency but with a modulated frequency. This modulated frequency is also passed to the mixer. The modulation of the oscillator signal preferably takes place in a randomly controlled manner. For the random modulation, a noise generator may be provided in particular. This configuration allows a plurality of proximity switches to be disposed close together, without the alternating fields of the individual proximity switches disturbing one another. Each proximity switch can in this case also oscillate with an individual fixed frequency. The other fixed frequencies are then mixed out as a consequence of the mixer stage. If the oscillator is modulated by a noise generator, it is statistically extremely improbable for the same frequencies to be transmitted from neighboring proximity switches over significant periods, so that this variant also leads to improve suitability for packet assembly. The circuit may be formed by individual components, for example by a plurality of inverting or non-inverting amplifier stages. It is also provided, however, for the entire mixer circuit, including the threshold switch and amplifier, to be integrated. In a further variant of the invention, it is provided that an oscillating circuit, comprising a coil and a capacitor, is set in oscillation by having an alternating voltage generated by an oscillator applied to it. This oscillating circuit can be damped by the approach of an oscillator, so that the oscillation is interrupted. The alternating voltage present at the oscillating circuit is picked off by means of a coupling capacitor or the like and fed to a multiplier, in particular after amplification. In this multiplier, the alternating voltage picked off at the oscillating circuit is subjected to multiplication by an alternating voltage signal coming directly from the oscillator in such a way that only in-phase signals are fed to the evaluation stage. This has the consequence that extraneous pulses which are received by the oscillating circuit, and in particular voltage peaks, are filtered out in the mixer. This solution can dispense with an additional "receiving coil". On the other hand, here, too, interference suppression can be achieved by the measuring signal having the undisturbed oscillator signal applied to it.

It is regarded as advantageous that the circuit has a symmetrical construction.

BRIEF DESCRIPTION OF THE DRAWINGS

Exemplary embodiments which indicate the main elements of the circuit are explained below with reference to attached circuit diagrams, in which:

FIG. 3 schematically shows a third exemplary embodiment of the invention,

FIG. 4 shows by way of example the construction of a ring sensor,

DETAILED DESCRIPTION OF THE PREFERRED EMBODIMENTS

With regard to the disposal and design both of the member generating a magnetic alternating field and of the member which can be influenced by the electric field, reference is made to the prior art cited in the introductory part of the description. For example, a differential coil arrangement may be constructed in the way described by DE 198 34 071.

Figure 1:
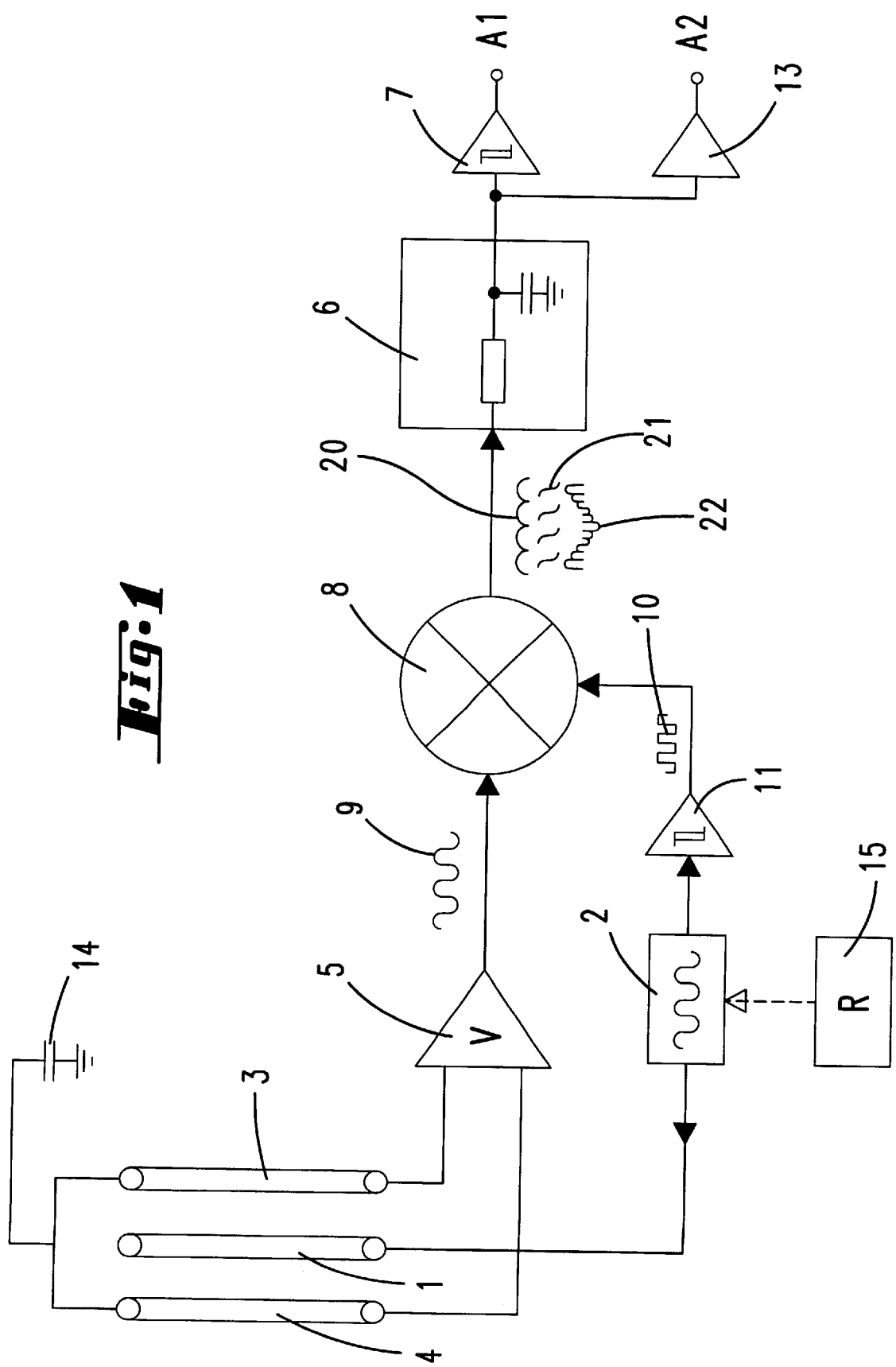
FIG. 1 schematically shows a first exemplary embodiment of the invention.

In the circuit diagram represented in FIG. 1, in which only the main electronic subassemblies are represented, the member 1 generating a magnetic alternating field is a transmitting coil, which has an alternating current of a frequency of 1 to 2 MHz applied to it by an oscillator 2. The alternating voltage generated in the oscillator is also coupled into a square-wave generator 11. This generates from it a square-wave signal 10. This square-wave signal 10 is fed to a mixer 8.

Located coaxially in relation to the transmitting coil 1 and at an axial distance from each other are two receiver coils 3, 4. These coils are connected as differential coils and are connected to ground at their common terminal via a capacitor 14. The two other terminals of the coils 3, 4 are connected to the two inputs of an amplifier 5, the output signal of which is a gain of the differential signal present between the two inputs. By tuning means not represented, for example potentiometers or the like, the differential voltage or the output voltage at the amplifier 5 is set to zero for the case in which the trigger has not approached, that is for the case of the uninfluenced field. Then only the oscillator signal 10 is present at the mixer 8, so that the output signal of the mixer is zero.

The output of the mixer 8 goes to a low-pass filter 6. This low-pass filter 6 effects a smoothing of the mixer output signal. The output of the low-pass filter may be passed either to a threshold switch 7, so that the output A1 is a digital value. Or the output signal of the low-pass filter is fed to an analog amplifier 13, so that the output signal A2 is an analog signal.

If the electromagnetic alternating field built up by the transmitter 1 is disturbed by a metal trigger which has approached, the two receiver coils 3 and 4 receive different signals. However, these signals are in phase conformity with the generated alternating field. Accordingly, the differential alternating voltage generated by the amplifier stage 5 and passed to the mixer is also in phase conformity with the coupled-in oscillator signal 10. The sign-sensitive logic operation carried out on the two signals 9, 10 in the mixer 8 has the effect that the mixer output signal substantially comprises only positive half-waves. This signal form is designated by the reference numeral 20.

If the electromagnetic alternating field is disturbed to the extent that the signal received from the receiver coils 3, 4 is phase-shifted with respect to the transmitted signal, the output signal of the mixer has approximately the form designated by the reference numeral 21. Now, not only positive output signals but also negative output signals occur. This high-frequency alternating voltage component is filtered out by the low-pass filter 6.

An alternating voltage signal of a different frequency which is received by the receiver coils 3, 4 and passed to the mixer 8 leads to a beat-like output signal of the mixer, which is indicated in FIG. 1 and is designated by the reference numeral 22. This signal also has an alternating voltage component, which is filtered out by the low-pass filter 6.

Figure 2:
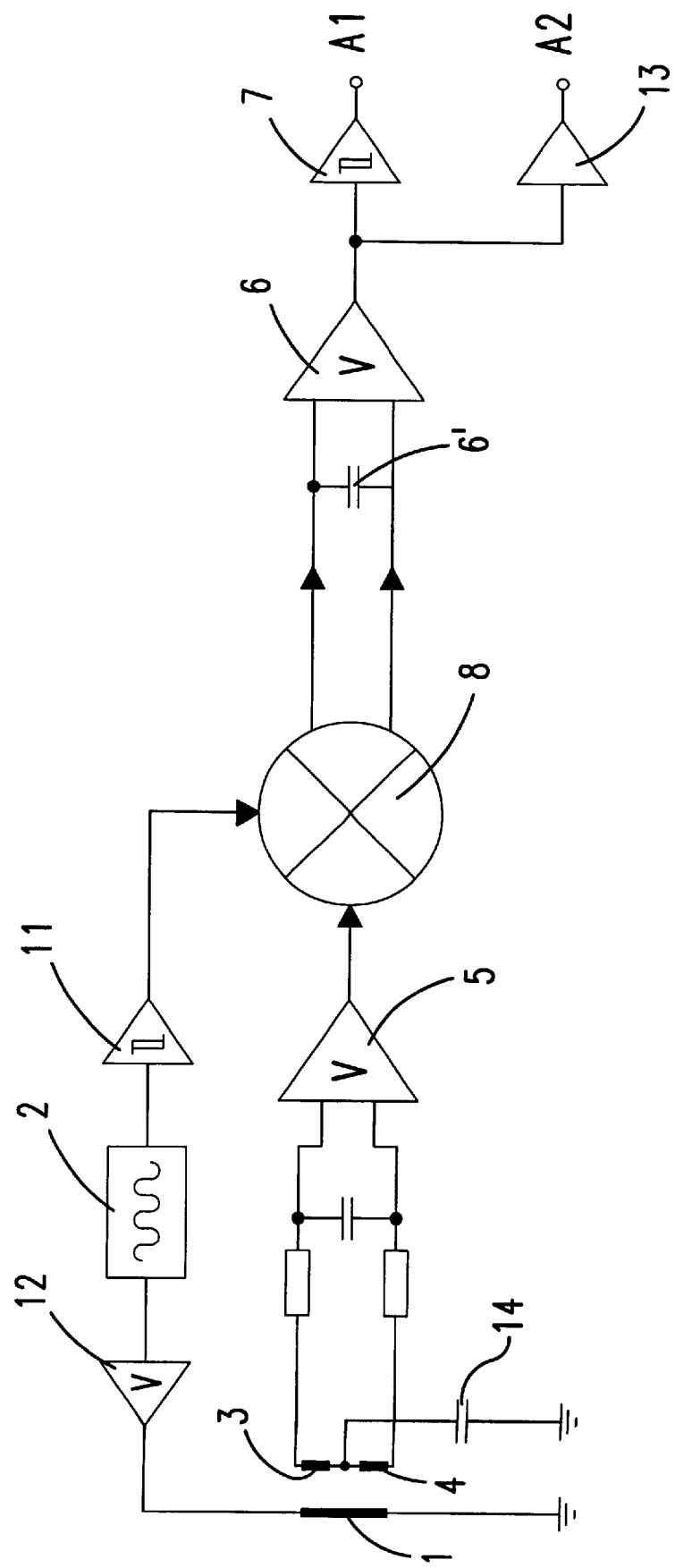
FIG. 2 schematically shows a second exemplary embodiment of the invention.

In the exemplary embodiment represented in FIG. 2, the alternating voltage generated by the oscillator 2 is passed to an amplifier 11 and an amplifier 12. The amplifier 12 operates a transmitting coil 1 with the high-frequency alternating voltage signal. The threshold amplifier 11 converts the oscillator signal 2 into a square-wave signal, which is fed to the mixer 8.

Two receiver coils 3, 4 which are connected as a differential coil arrangement are also provided in this circuit. The differential signal is passed to an amplifier 5, which feeds it in amplified form to the mixer. The mixer generates two output signals here. The size and sign of the difference of the two output signals of the mixer depend on the phase between the input signal and the reference signal. Here, too, the output of the amplified signal can be passed to a threshold switch 7 or an output amplifier 13.

In the exemplary embodiment represented in FIG. 3, the oscillator 2 applies a fixed frequency to a transmitting oscillating circuit comprising a coil 1 and a capacitor 16.

Instead of applying a fixed frequency to the transmitting coil, the coil may also be operated as an inductance of a freely oscillating oscillator. This can be made to oscillate by appropriately reducing the damping. The oscillating state of the oscillator 1, 16 is measured by means of a measuring coil 3. The measuring-coil signal is amplified by means of an amplifier 5 and passed to a mixer. In the mixer 8, the alternating voltage 2 generated by the oscillator 2 is likewise passed in the form of square-wave signals [lacuna]. The mixer output signal, which here, too, is again in the form of a differential signal, is smoothed by means of a capacitor 6. Here, too, the mixing of the signals again has a filtering function. Interference signals which are received by the measuring coil 3 and which are not in phase conformity or frequency conformity with the oscillator alternating voltage are filtered out.

A development of the circuit represented in FIG. 1 consists in that the oscillator 2 does not oscillate with a fixed frequency but with a modulated frequency. In particular, the oscillator frequency is randomly modulated by a noise generator 15. This has the consequence that many proximity switches of the same construction can be operated in direct proximity without special shielding. The oscillators oscillate completely independently of one another as a result of the modulation. The same objective can also be achieved by all the oscillators oscillating with an individual fixed frequency.

FIG. 4 shows a ring sensor with a coil in the form of a cylindrical sleeve, which forms the field-generating member. In this coil 1, which is shielded by a casing 18, there is a measuring coil 3, which measures the magnetic alternating field prevailing there.

The entire ring sensor arrangement 17 serves the purpose of detecting a trigger, which falls through the coils 1, 3 in a way corresponding to the arrow 19.

Instead of one transmitting/receiving coil, a plurality of transmitting/receiving coils may also be provided.

Figure 5:
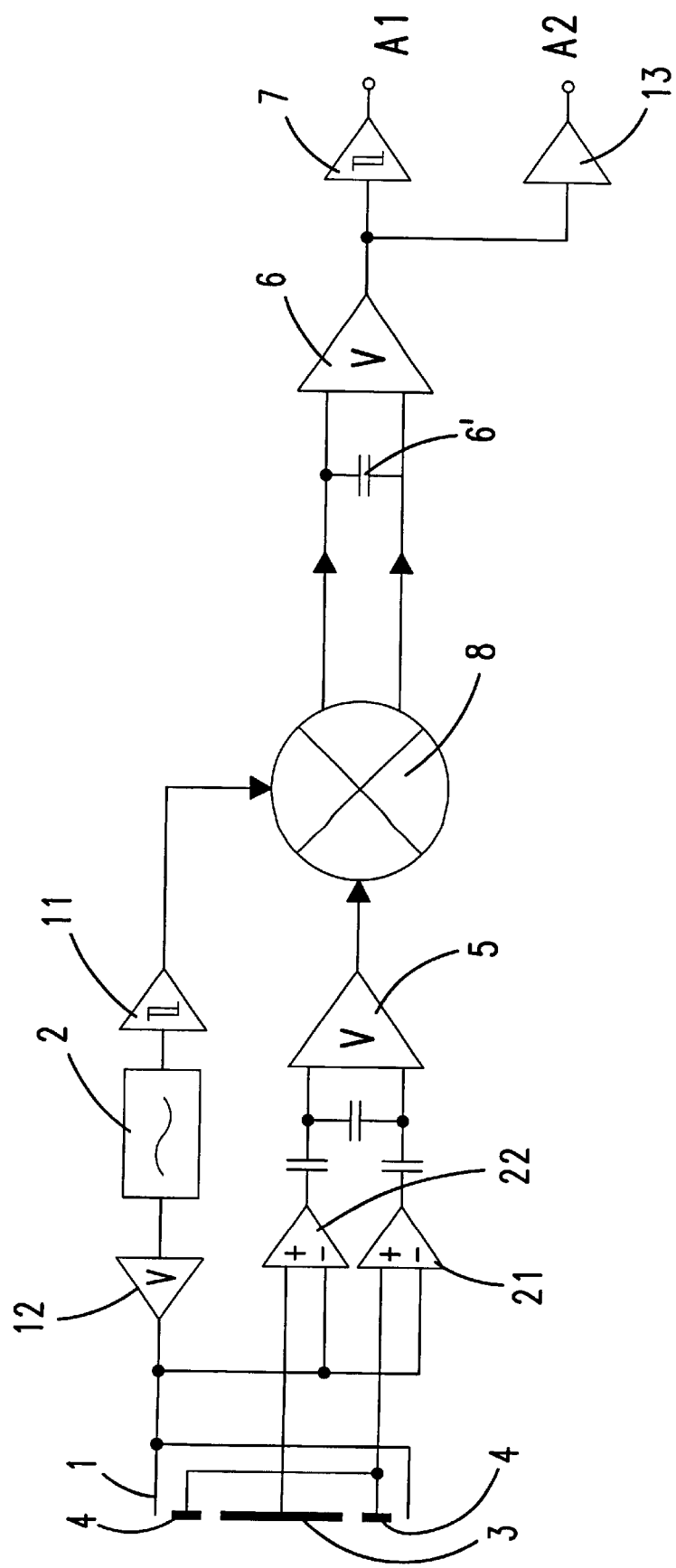
FIG. 5 shows a fourth exemplary embodiment of the invention.
Figure 6:
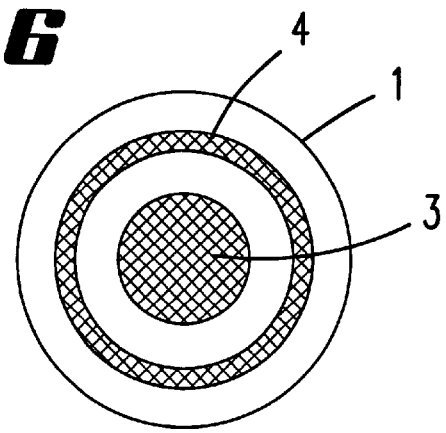
FIG. 6 shows the measuring head of the fourth exemplary embodiment.

In the exemplary embodiment represented in FIG. 5, the proximity switch in question is a capacitive proximity switch. The member generating the electromagnetic alternating field is in this case a pot-shaped shielding electrode 1. Lying in this pot-shaped shielding electrode 1 are a main electrode 3 and a compensation electrode 4. The main electrode 3 is a circular metallic disk, which is concentrically surrounded by the pot 1. Located between the edge of the pot 1 and the main electrode 3 there is an annular compensation electrode 4, which is insulated both with respect to the transmitting electrode 1 and with respect to the main electrode 3.

The transmitting electrode 1 has an electrical alternating voltage, which is generated in the oscillator 2, applied to it.

The alternating voltage generated in the oscillator 2 is amplified by means of an amplifier 12. Between ground and the oscillator amplifier output there lies, on the one hand, the main electrode 3 and, on the other hand, the compensation electrode 4, to a certain extent as a capacitive bridge circuit. The capacitive interaction takes place by the approach of a corresponding trigger, which establishes the capacitive coupling to ground.

When a trigger approaches the members 3, 4 influenced by the field, a signal with a small amplitude is present at their terminals. This signal is provided with an alternating voltage offset which is considerably higher than the actual signal.

Both the signal of the main electrode 3 and the signal of the compensation electrode 4 are passed to separate differential amplifiers 21, 22. The terminals of the electrodes are connected to the non-inverting inputs of the differential amplifiers 21, 22.

An oscillator signal of an identical phase is present at the inverting inputs of the differential amplifiers 21, 22, so that the differential amplifiers 21, 22 have at their outputs a signal which is reduced by the value of the reference alternating voltage present, from 12.

The amplitude of the reference alternating voltage is set such that the offset which is present at the terminals of the main electrode 1 and compensation electrode 4 is compensated.

The output signals of the differential amplifiers 21, 22 are fed to a differential amplifier 5. This passes the difference obtained from these signals on in the way described above to a mixer 8, which supplies an output signal in the manner described above.

Figure 7A:
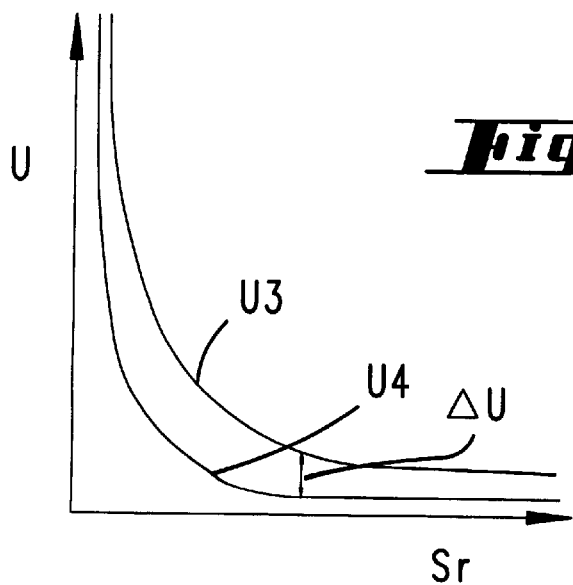
FIGS. 7a,b show the voltages present at the differential amplifier, which are formed by application of the measuring signal with the inverted oscillator frequency and their difference as a function of the switching distance.
Figure 7B:
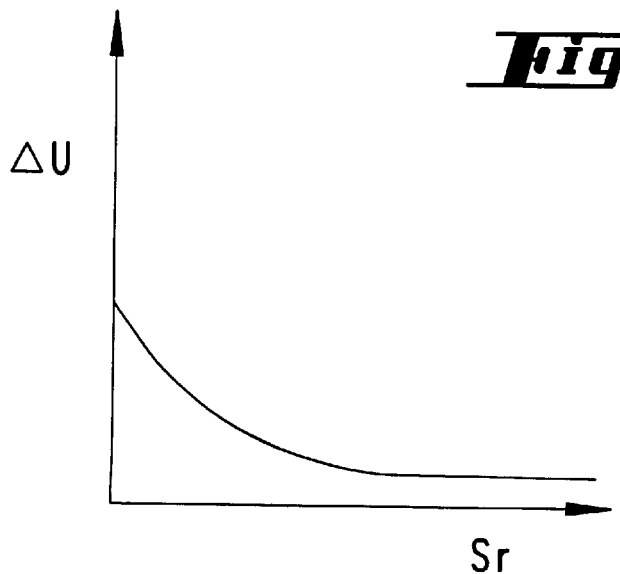

FIG. 7a shows the output signal U3, reduced by the offset, of the main electrode 3 and U4 of the compensation electrode 4 in dependence on the switching distance SR [sic]. While the main electrode is sensitive to remote influencing, the compensation electrode 4 is sensitive to near trigger positions. FIG. 7b shows the difference between the two signals U3 and U4.

Figure 8:
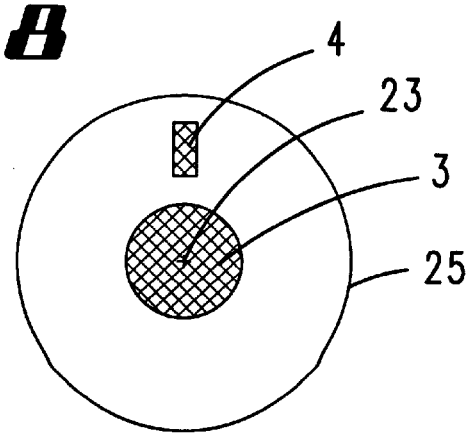
FIG. 8 shows a further exemplary embodiment of a measuring head.
Figure 9:
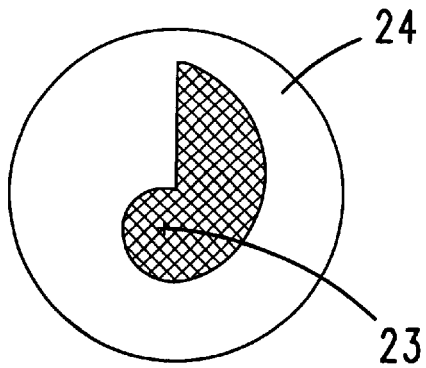
FIG. 9 shows a rotary trigger for interaction with the sensor head according to FIG. 8.

The example of usage which is represented in FIGS. 8 and 9 shows a rotary transducer. The sensor disk 25 has in this case a circular main sensor 3. The rotary trigger 24 can rotate about the center 23 of said main sensor. The compensation electrode 4 is now not of an annular form, but is formed as a single surface lying eccentrically in relation to the center point 23. On the rotary trigger 24 there is a metal covering with a spiral edge line, so that the degree of coverage of the compensation electrode 4 varies according to the angle of rotation.

Figure 10:
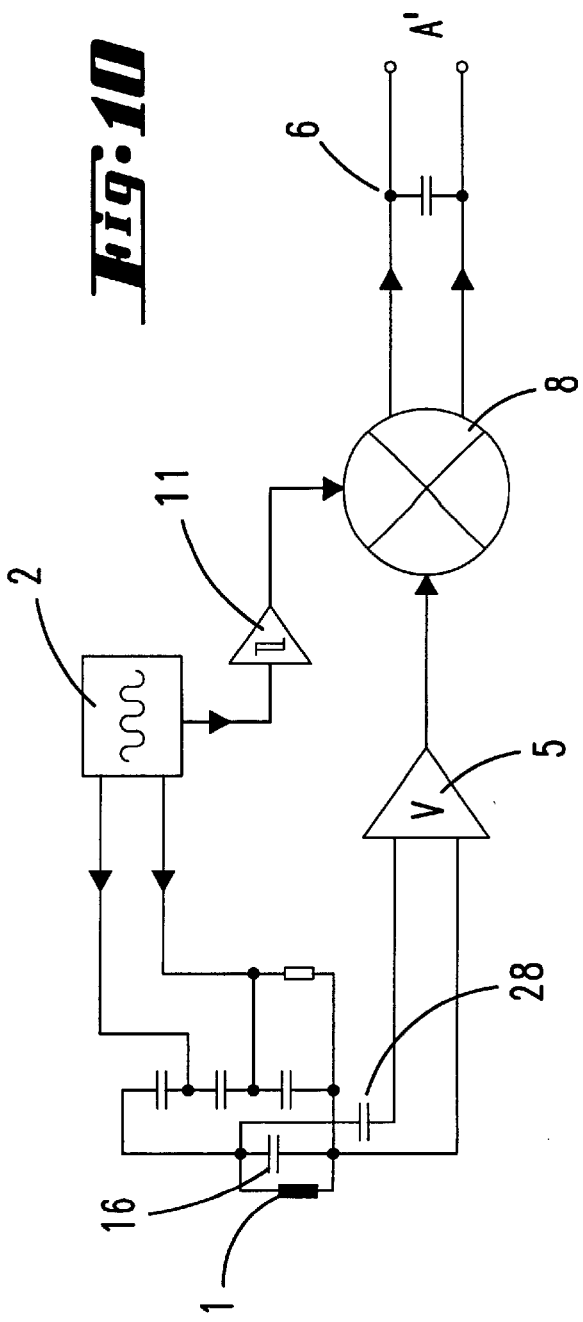
FIG. 10 shows a circuit diagram of a further exemplary embodiment and FIG. 11 shows in section an exemplary embodiment of a measuring head which is connected in a way corresponding to the circuit of FIG. 10.
Figure 11:
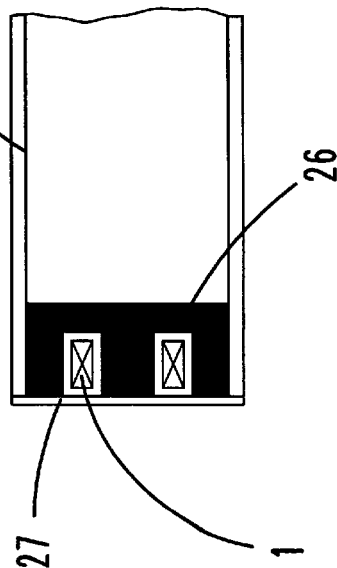

In the exemplary embodiment represented in FIGS. 10 and 11, the electromagnetic alternating field is generated by an oscillating circuit, which is excited in a way substantially corresponding to the circuit of FIG. 3. The oscillating circuit comprises a coil 1 and a capacitor 16. This oscillating circuit 1, 16 is excited by the output alternating voltage of the oscillator 2. The output alternating voltage of this oscillator 2 is applied to the oscillating circuit 1, 16 via capacitors and, if appropriate, resistors.

Instead of applying a fixed frequency to the transmitting coil, the coil may also be operated as an inductance of a freely oscillating oscillator. When the trigger has not approached, the oscillating circuit 1, 16 oscillates with the frequency of the oscillator 2. If a trigger is brought into the vicinity of the oscillating circuit 1, 16, and consequently the oscillating circuit 1, 16 is damped, the oscillation in the oscillating circuit 1, 16 is interrupted.

If interference fields are present, it may happen, however, that the oscillating circuit 1, 16 is nevertheless excited. This may be caused for example by voltage peaks or the like. In the exemplary embodiment, the alternating voltage which is present at the oscillating circuit 1, 16, and may be affected by interference, is fed to a differential amplifier 5. This takes place by coupling out by means of a capacitor 28. The amplified differential signal is fed to a mixer 8. There, it is then subjected to multiplication by an amplified oscillator signal. This avoids interference pulses received by the oscillating circuit 1, 16 from reaching the evaluation stage. These interference pulses are suppressed by the multiplicative operation to which they are subjected in the mixer 8.

FIG. 11 shows a housing tube 18, which may consist of metal. At the extreme end of the housing tube 18 there is a front plate 27. Behind the front plate 27, which allows magnetic fields to pass through, there is an oscillating circuit coil 1. The oscillating-circuit coil 1 may lie in, or be cast into, a coil housing 26. For the sake of clarity, the other component parts of the proximity switch have been omitted.

What is claimed is:

1. Electronic proximity switch with a member (1) generating an alternating electromagnetic field, which is excited by an oscillator (2), an influencing of the alternating field, induced by approach of a trigger, being evaluated by an electronic signal-evaluation stage (8), including an amplifier stage (5), for emission of an output signal, wherein a signal to be evaluated has the oscillator frequency applied to it before its evaluation.

2. Electronic proximity switch according to claim 1, wherein the signal to be evaluated is obtained by a member (3, 4) influenced by the electromagnetic field.

3. Electronic proximity switch according claim 1, wherein the oscillator frequency inverted with a correct phase is added to the measuring signal to compensate for offset.

4. Electronic proximity switch according to claim 1, further comprising at least two members (3, 4) influenced by the field.

5. Electronic proximity switch according to claim 4, wherein each of measuring signals emitted by the at least two members (3, 4) influenced by the field has the oscillator frequency applied to thereto.

6. Electronic proximity switch according to claim 5, wherein the signal-evaluation stage is fed a differential signal formed from the measuring signals to which the oscillator frequency has been applied.

7. Electronic proximity switch according to claim 1, wherein the member generating the alternating electromagnetic field is an electrode, in particular a shielding electrode (1) of a capacitive proximity switch.

8. Electronic proximity switch according to claim 2, wherein the member (3) influenced by the field is a main electrode of a capacitive proximity switch.

9. Electronic proximity switch according to claim 8, wherein at least a second member (3) influenced by the electromagnetic alternating field is a compensation electrode of the capacitive proximity switch.

10. Electronic proximity switch according to claim 9, wherein the main electrode (3) develops a greater remote effect than the compensation electrode (4).

11. Electronic proximity switch according to claim 8, further comprising a compensation electrode (4), disposed eccentrically in relation to the main electrode (3), and a rotary trigger (34) which can rotate about a center (23) of the main electrode (4).

12. Electronic proximity switch according to claim 2, wherein the measuring signal (9) emitted by the field-influenced member (3, 4) is mixed in a logically multiplying manner in a mixer (8) of the signal-evaluation stage with the oscillator frequency.

13. Electronic proximity switch according to claim 12, wherein the mixer (8) has a square-wave signal (10), converted from the oscillator frequency, applied thereto.

14. Electronic proximity switch according to claim 12, further comprising a low-pass filter (6) connected downstream of the mixer (8).

15. Electronic proximity switch according to claim 1, wherein the measuring signal passed to the mixer (8) is formed from a difference between two input signals.

16. Electronic proximity switch according to claim 1, wherein the field-generating member is a transmitting coil (1).

17. Electronic proximity switch according to claim 2, wherein the member influenced by the field comprises at least one receiver coils (3, 4).

18. Electronic proximity switch according to claim 2, wherein the member influenced by the field comprises two receiver coils (3, 4) connected as a differential coil arrangement.

19. Electronic proximity switch according to claim 1, wherein the field-generating member (1) is an oscillator coil.

20. Electronic proximity switch according to claim 19, wherein the oscillator coil (1) is coordinated to a freely oscillating oscillator.

21. Electronic proximity switch according to claim 1, wherein the member (3) influenced by the field is a measuring coil.

22. Electronic proximity switch according to claim 2, wherein the field-generating member and the member influenced by the field are in each case capacitively acting electrodes.

23. Electronic proximity switch according to claim 1, wherein the oscillator frequency is modulated and is influenced by a noise generator or random-value generator.

24. Arrangement of electronic proximity switches according to claim 1, wherein the oscillator frequencies of a plurality of proximity switches disposed close together oscillate with different frequencies.

25. Arrangement of electronic proximity switches according to claim 1, wherein the oscillator (2) sets in oscillation an oscillating circuit which is dampable when the trigger approaches and comprises a coil (1) as the member and a capacitor (16), alternating voltage present at the oscillating circuit (1, 16) having the alternating voltage of the oscillator (2) applied thereto by a multiplicative operation in a mixer (8).

\* \* \* \* \*